US009625708B2

(12) United States Patent
Toyota

(10) Patent No.: US 9,625,708 B2
(45) Date of Patent: Apr. 18, 2017

(54) OPTICAL DEFLECTOR AND IMAGE FORMING APPARATUS INCLUDING THE SAME

(71) Applicant: KYOCERA Document Solutions Inc., Osaka (JP)

(72) Inventor: Yuji Toyota, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 15/185,547

(22) Filed: Jun. 17, 2016

(65) Prior Publication Data
US 2016/0377859 A1 Dec. 29, 2016

(30) Foreign Application Priority Data

Jun. 24, 2015 (JP) ................................ 2015-126499

(51) Int. Cl.
*G02B 26/08* (2006.01)
*B81B 3/00* (2006.01)
*G02B 26/10* (2006.01)
*G03G 15/043* (2006.01)
*G03G 15/04* (2006.01)

(52) U.S. Cl.
CPC ........ *G02B 26/0858* (2013.01); *B81B 3/0078* (2013.01); *G02B 26/101* (2013.01); *G03G 15/0409* (2013.01); *G03G 15/0435* (2013.01); *B81B 2201/042* (2013.01)

(58) Field of Classification Search
CPC .............. G02B 26/0916; G02B 26/085; G02B 26/0858; G02B 26/105; G02B 26/101; B81B 3/0078; G03G 15/0409; G03G 15/0435
USPC ......... 359/199.1, 199.4, 200.8, 224.1–226.1; 310/331
See application file for complete search history.

(56) References Cited

U.S. PATENT DOCUMENTS 7,605,965 B2 * 10/2009 Tani ..................... G02B 26/105
310/331

FOREIGN PATENT DOCUMENTS

JP 2011-123176 6/2011

* cited by examiner

*Primary Examiner* — Euncha Cherry
(74) *Attorney, Agent, or Firm* — Wenderoth, Lind & Ponack, L.L.P.

(57) ABSTRACT

An optical deflector is a piezoelectrically-driven optical deflector including a vibration mirror part having a reflection surface portion for reflecting light, a torsion bar part connected to the vibration mirror part, and a piezoelectric element that allows the vibration mirror part to swing around the torsion bar part so as to vibrate. Protruding portions are formed respectively at both end portions of the vibration mirror part in a main scanning direction of reflected light to protrude to an outer side in the main scanning direction.

5 Claims, 9 Drawing Sheets

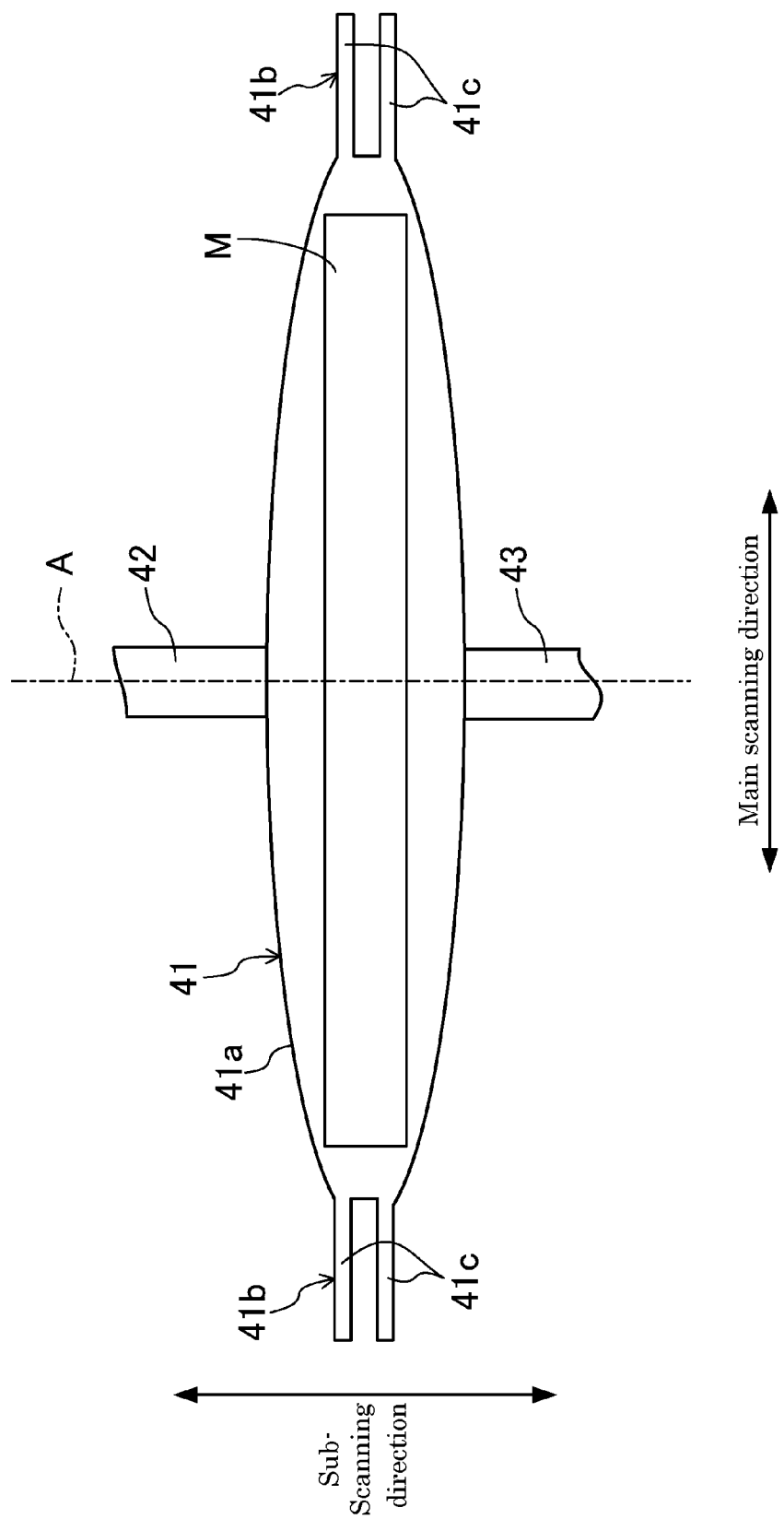

OPTICAL DEFLECTOR AND IMAGE FORMING APPARATUS INCLUDING THE SAME

CROSS-REFERENCE TO RELATED APPLICATION

This application is based upon and claims the benefit of priority from Japanese Patent Application No. 2015-126499 filed on Jun. 24, 2015, the entire contents of which are incorporated herein by reference.

BACKGROUND

The technology of the present disclosure relates to an optical deflector and an image forming apparatus including the same.

Conventionally, there is known a resonance type optical deflector including a vibration mirror part and a torsion bar part that supports the vibration mirror part. In this optical deflector, there is a problem that, when the vibration mirror part vibrates, air flows generated around the vibration mirror part are separated from an end edge of the vibration mirror part and destabilize the behavior (amplitude) of the vibration mirror part. In order to solve such a problem, there is proposed a technology for adhering a rectifying member to an opposite side surface of a reflection surface side of the vibration mirror part so as to arrange the flow of air. This rectifying member has a semicylindrical shape. In this way, the separation of the air flows generated around the vibration mirror part is suppressed.

SUMMARY

An optical deflector according to one aspect of the present disclosure includes a vibration mirror part, a torsion bar part, and a piezoelectric element. The vibration mirror part has a reflection surface portion for reflecting light. The torsion bar part is connected to the vibration mirror part. The piezoelectric element allows the vibration mirror part to swing around the torsion bar part so as to vibrate.

Protruding portions are formed at both end portions of the vibration mirror part in a main scanning direction of reflected light to protrude to an outer side in the main scanning direction.

BRIEF DESCRIPTION OF THE DRAWINGS

FIG. 10 is a diagram corresponding to FIG. 4, which illustrates an embodiment 2.

DETAILED DESCRIPTION

Hereinafter, an example of an embodiment will be described in detail on the basis of the drawings. It is noted that the technology of the present disclosure is not limited to the following embodiments.

<<Embodiment 1>>

Figure 1:
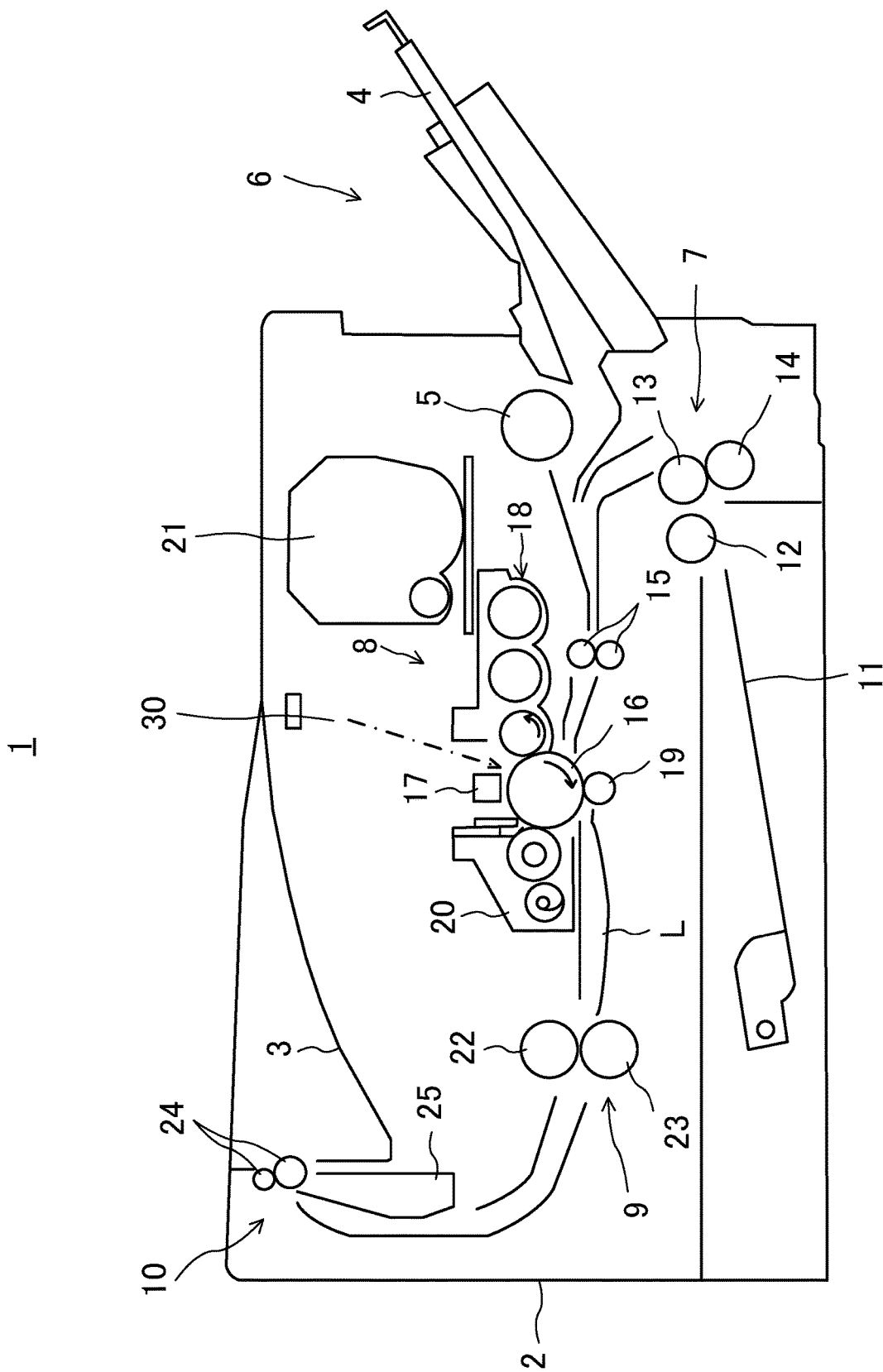
FIG. 1 is a schematic configuration diagram illustrating an image forming apparatus including an optical deflector in an embodiment.

FIG. 1 is a sectional view illustrating a schematic configuration of a laser printer 1 which is an example of an image forming apparatus in the present embodiment.

As illustrated in FIG. 1, the laser printer 1 includes a box-like printer body 2, a manual paper feeding unit 6, a cassette paper feeding unit 7, an image forming unit 8, a fixing unit 9, and a paper discharge unit 10. Accordingly, the laser printer 1 is configured to form an image on a paper on the basis of image data transmitted from a terminal (not illustrated) and the like while conveying the paper along a conveyance path L in the printer body 2.

The manual paper feeding unit 6 has a manual tray 4 provided at one side portion of the printer body 2 so as to be openable and closable, and a manual paper feeding roller 5 provided in the printer body 2 so as to be rotatable.

The cassette paper feeding unit 7 is provided at a bottom portion of the printer body 2. The cassette paper feeding unit 7 includes a paper feeding cassette 11 that stores a plurality of papers overlapped one another, a pick-up roller 12 that takes out the papers in the paper feeding cassette 11 one by one, and a feed roller 13 and a retard roller 14 that separate the taken-out papers one by one and send the separated paper to the conveyance path L.

The image forming unit 8 is provided above the cassette paper feeding unit 7 in the printer body 2. The image forming unit 8 includes a photosensitive drum 16 serving as an image carrying member provided in the printer body 2 so as to be rotatable, a charging device 17, a developing unit 18, a transfer roller 19, a cleaning unit 20, an optical scanning device 30 arranged above the photosensitive drum 16, and a toner hopper 21, wherein the charging device 17, the developing unit 18, the transfer roller 19, and the cleaning unit 20 are arranged around the photosensitive drum 16. Accordingly, the image forming unit 8 is configured to form an image on the paper supplied from the manual paper feeding unit 6 or the cassette paper feeding unit 7.

At the conveyance path L, a pair of resist rollers 15 are provided to temporarily keep the sent paper waiting and then supply the paper to the image forming unit 8 at a predetermined timing.

The fixing unit 9 is arranged at a lateral side of the image forming unit 8. The fixing unit 9 includes a fixing roller 22 and a pressure roller 23 brought into press contact with each other so as to rotate. Accordingly, the fixing unit 9 is configured to fix a toner image, which has been transferred to the paper in the image forming unit 8, to the paper.

The paper discharge unit 10 is provided above the fixing unit 9. The paper discharge unit 10 includes a paper discharge tray 3, a paper discharge roller pair 24 for conveying the paper to the paper discharge tray 3, and a plurality of conveying guide ribs 25 for guiding the paper to the paper discharge roller pair 24. The paper discharge tray 3 is formed in a concave shape at an upper portion of the printer body 2.

When the laser printer 1 receives image data, the photosensitive drum 16 in the image forming unit 8 is rotationally driven and the charging device 17 charges the surface of the photosensitive drum 16.

Then, laser light is emitted from the optical scanning device 30 to the photosensitive drum 16 on the basis of the image data. The laser light is irradiated, so that an electrostatic latent image is formed on the surface of the photosensitive drum 16. The electrostatic latent image formed on the photosensitive drum 16 is developed by the developing unit 18, so that the electrostatic latent image is visualized as a toner image.

Thereafter, the paper passes through between the transfer roller 19 and the photosensitive drum 16. At this time, by transfer bias applied to the transfer roller 19, the toner image of the surface of the photosensitive drum 16 is moved and transferred to the paper. The paper with the transferred toner image is heated and pressed by the fixing roller 22 and the pressure roller 23 in the fixing unit 9. As a consequence, the toner image is fixed to the paper.

Figure 2:
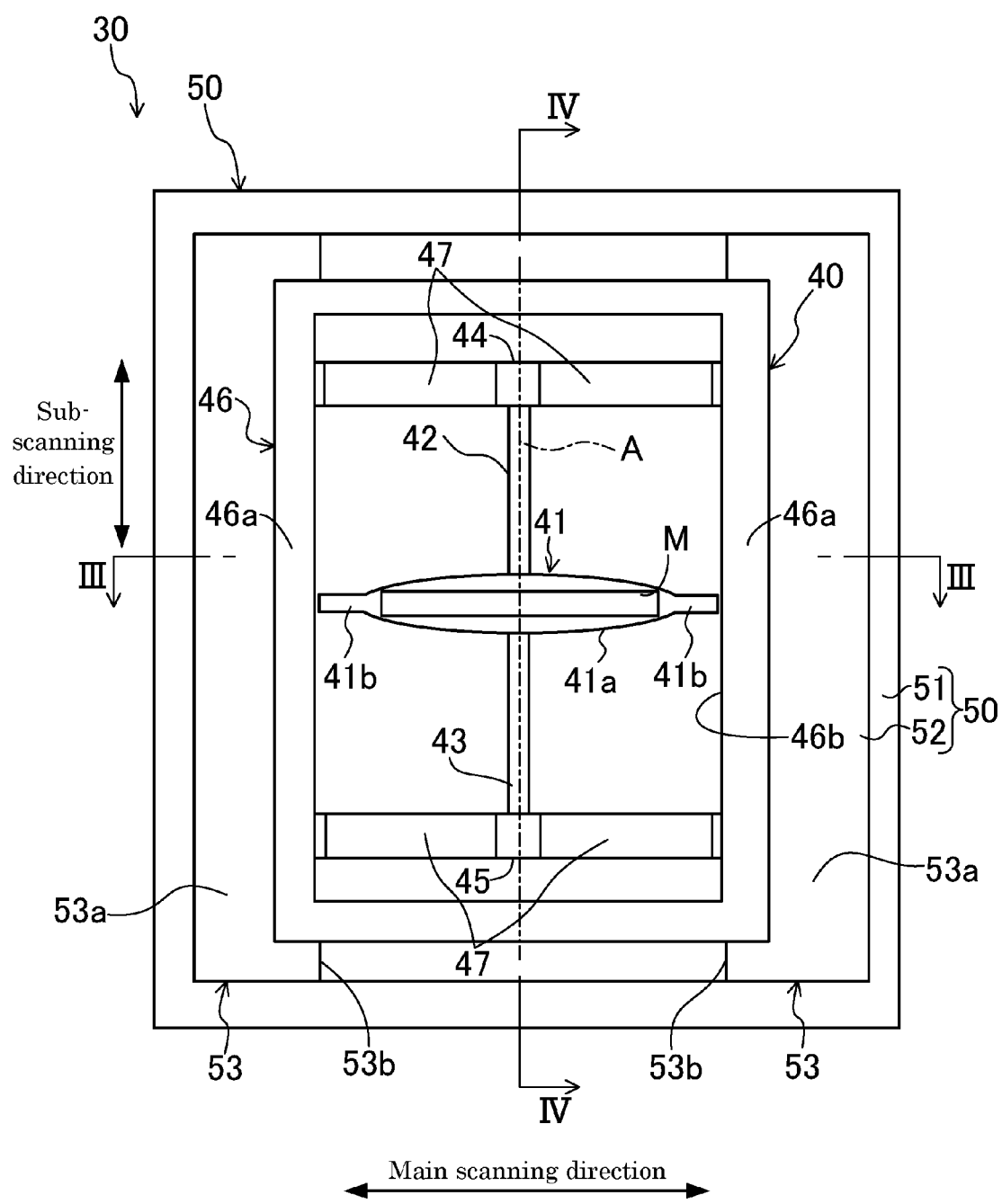
FIG. 2 is a plan view viewed from a reflection surface side, which illustrates an optical scanning device including an optical deflector in an embodiment.
Figure 3:
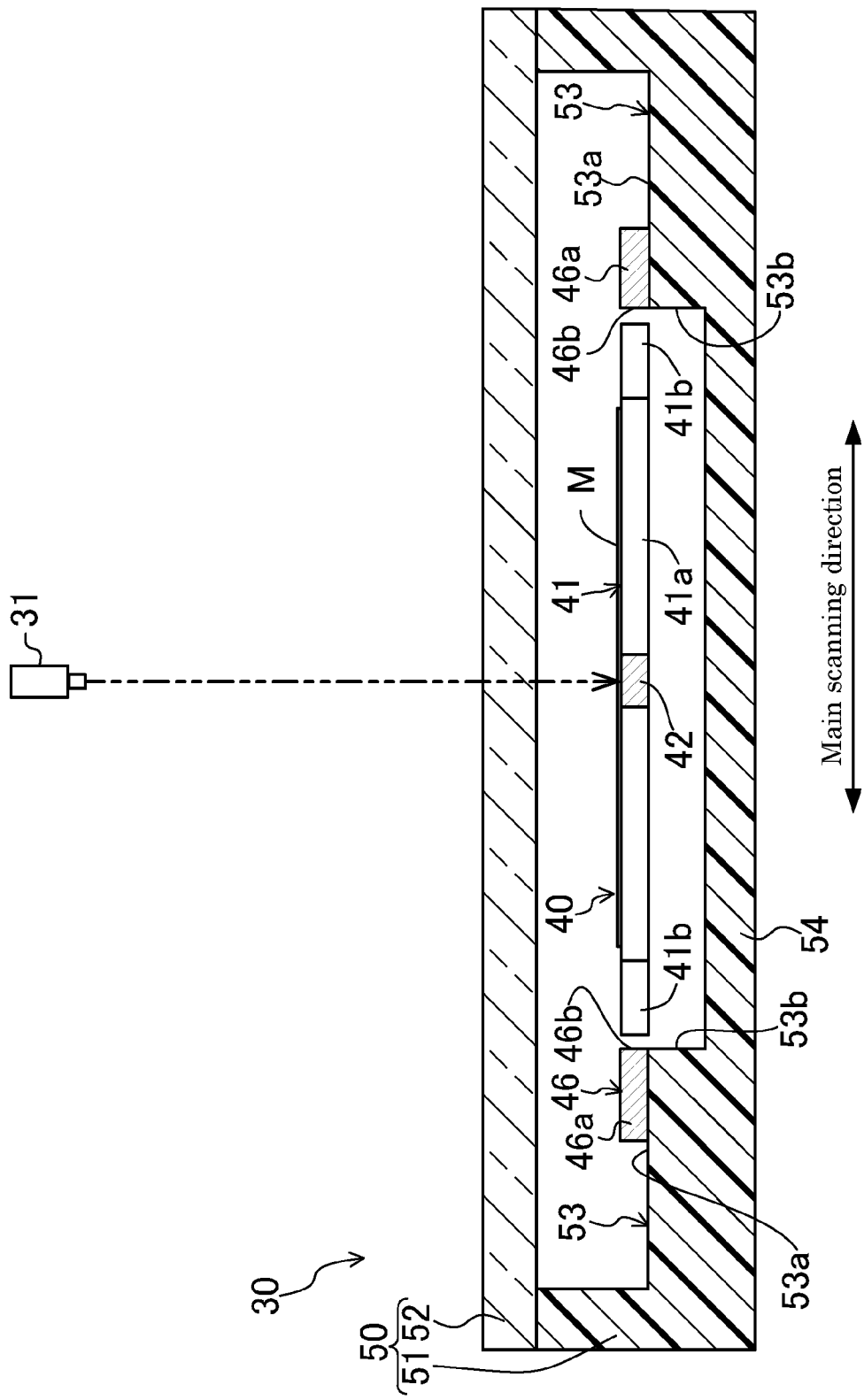
FIG. 3 is a sectional view taken along line III-III of FIG. 2.

As illustrated in FIG. 2 and FIG. 3, the optical scanning device 30 has a light source 31 (illustrated only in FIG. 3) that emits light, an optical deflector 40, and a casing 50 that receives the optical deflector 40.

The casing 50 is formed in an approximately rectangular parallelepiped shape in a whole view. The casing 50 has a bottomed casing body 51 in which its one side (a front side of the paper surface of FIG. 2) in a height direction is opened, and a light transmitting lid 52 that closes the opened side of the casing body 51. The casing body 51, for example, is configured with a resin material and the lid 52, for example, is configured by glass. The lid 52 is configured to allow both light incident into a vibration mirror part 41 and light reflected by the vibration mirror part 41 to pass therethrough. Details of the vibration mirror part 41 will be described later.

The aforementioned optical deflector 40 is a so-called MEMS (Micro Electro Mechanical System) device and is formed by performing an etching process on a silicon plate.

In detail, as illustrated in FIG. 2, the optical deflector 40 has the vibration mirror part 41, first and second torsion bar parts 42 and 43, first and second transverse plate parts 44 and 45, and an approximate rectangular plate-shaped fixed frame part 46.

Figure 4:
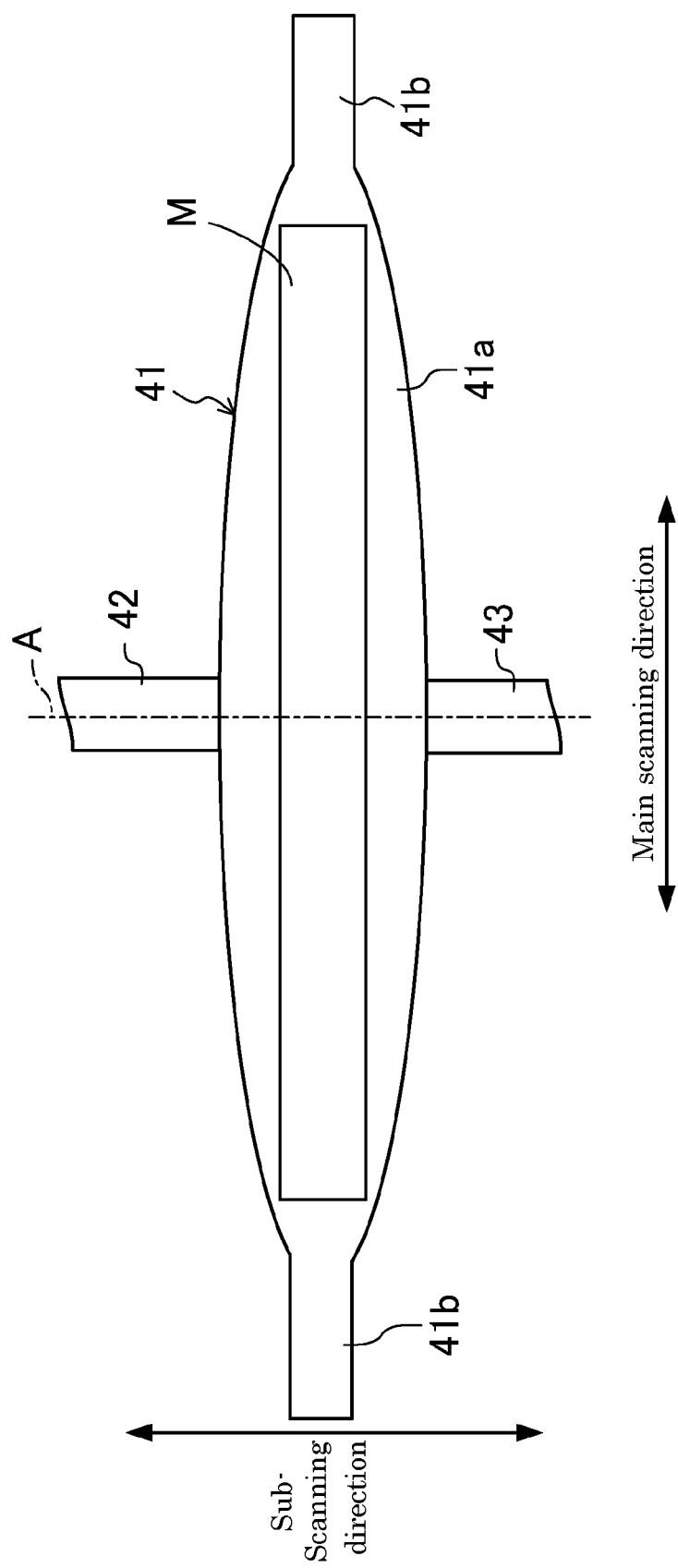
FIG. 4 is an enlarged plan view of a vibration mirror part.

The vibration mirror part 41 reflects light from the light source 31 and allows the reflected light to be scanned in a main scanning direction. In detail, the vibration mirror part 41 has an elliptical columnar portion 41a and a pair of protruding portions 41b. The elliptical columnar portion 41a is formed in an elliptical shape long in the main scanning direction in a plan view (see FIG. 4). Each protruding portion 41b protrudes to an outer side of the vibration mirror part 41 in the main scanning direction from both end portions of the vibration mirror part 41 in the main scanning direction. Each protruding portion 41b has a rectangular shape long in the main scanning direction in the plan view. The vibration mirror part 41 is arranged inside the rectangular frame-shaped fixed frame part 46. As illustrated in FIG. 3, an inner side surface of a vertical side portion 46a of the fixed frame part 46 constitutes a facing surface 46b which faces a front end surface of each protruding portion 41b. The facing surface 46b is formed in a flat surface shape extending in a sub-scanning direction.

At one side in a thickness direction of the vibration mirror part 41, a reflection surface portion M is formed to reflect the light emitted from the light source 31. The reflection surface portion M, for example, is configured by a light reflection film including aluminum or chrome in order to enhance the reflectivity of light. The vibration mirror part 41 swings around the aforementioned torsion bar parts 42 and 43 and vibrates, thereby changing the reflection direction of light incident into the reflection surface portion M from the light source 31 and thus allowing the light to be reciprocally scanned in the main scanning direction. The scanning light reflected by the reflection surface portion M is irradiated into the surface of the photosensitive drum 16.

The aforementioned first and second torsion bar parts 42 and 43 have a rectangular plate shape long in the sub-scanning direction. Both the torsion bar parts 42 and 43 are arranged on an extension line (an extension line of a short axis) of a swing shaft center A of the vibration mirror part 41 in the plan view. The first torsion bar part 42 has one side portion connected to a center portion of the vibration mirror part 41 in the main scanning direction and the other side portion connected to a center portion of a longitudinal direction of the first transverse plate part 44. The second torsion bar part 43 has one side portion connected to the center portion of the vibration mirror part 41 in the main scanning direction and the other side portion connected to the center portion of a longitudinal direction of the second transverse plate part 45. Accordingly, both the torsion bar parts 42 and 43 support the vibration mirror part 41 so as to be swingable (vibratable) around the swing shaft center A.

The first and second transverse plate parts 44 and 45 are arranged at both sides of the vibration mirror part 41 in the sub-scanning direction. The first and second transverse plate parts 44 and 45 are arranged across a pair of vertical side portions 46a of the fixed frame part 46. The aforementioned fixed frame part 46 is supported by a pair of pedestals 53 formed in the casing body 51. Each pedestal 53 has a support surface 53a that supports the fixed frame part 46 and a side 53b vertical to the support surface 53a. The side 53b of the pedestal 53 is a flat surface extending in the sub-scanning direction and is formed to be level with an inner side surface (the facing surface 46b) of the vertical side portion 46a of the fixed frame part 46.

The aforementioned first transverse plate part 44 and second transverse plate part 45 are respectively mounted with two piezoelectric elements 47 (FIG. 2) serving as driving units. Each piezoelectric element 47 is electrically connected to a driving circuit (not illustrated). Furthermore, an application voltage applied to each piezoelectric element 47 is changed at a predetermined frequency by the driving circuit, so that the piezoelectric elements 47 are extended and contracted for vibration. The vibration frequency of the piezoelectric element 47 is set to coincide with a resonance frequency of the vibration mirror part 41. When the piezoelectric element 47 vibrates at the aforementioned resonance frequency, the vibration mirror part 41 resonates and swings around both the torsion bar parts 42 and 43.

Figure 5:
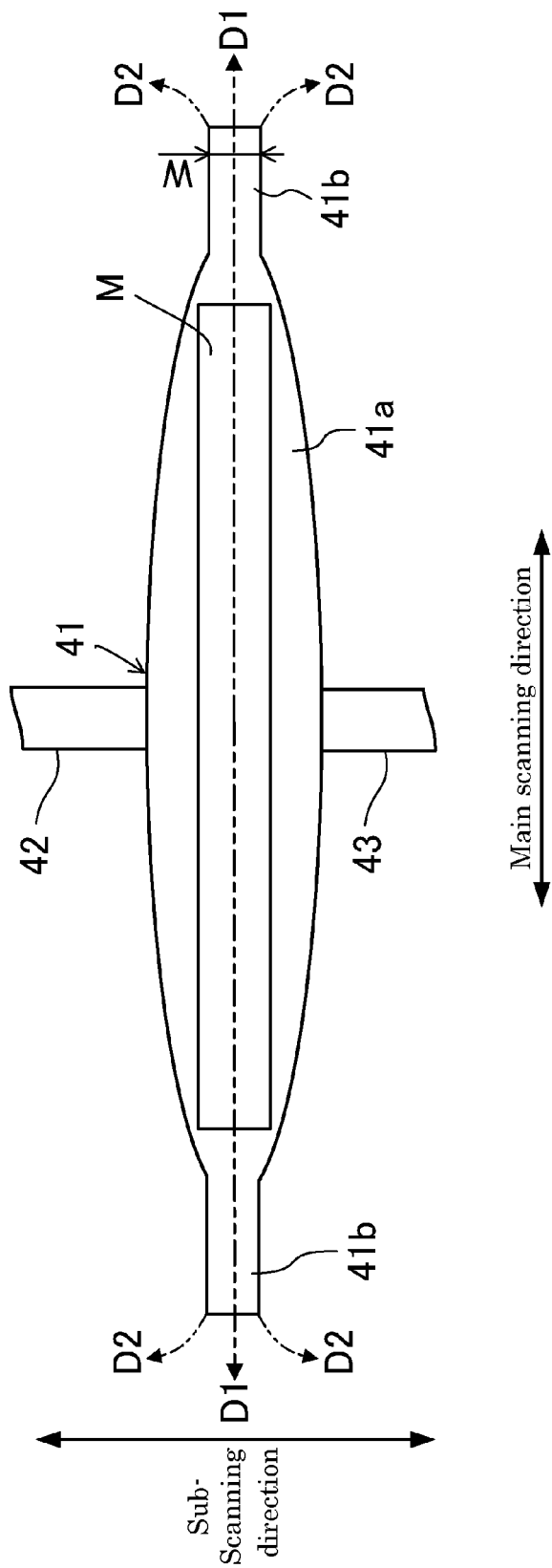
FIG. 5 is a schematic diagram schematically illustrating air flows around a vibration mirror part.

Herein, when the vibration mirror part 41 vibrates around both the torsion bar parts 42 and 43, a first air flow D1 and a second air flow D2 are generated around the vibration mirror part 41 as illustrated in FIG. 5. The first air flow D1 is a flow generated on the vibration mirror part 41 by centrifugal force caused by the swing of the vibration mirror part 41, and flows toward the outer side from the inner side of the vibration mirror part 41 in the main scanning direction. The second air flow is a flow generated when boundary layers of both side surfaces of the vibration mirror part 41 in the sub-scanning direction are separated, and flows toward the outer side from the inner side of the sub-scanning direction. In a conventional optical deflector 40, there is a problem that since the flow speed difference between the first air flow D1 and the second air flow D2 is large, many spiral air flows are generated at both end portions of the vibration mirror part 41 in the main scanning direction, so that air resistance of the vibration mirror part 41 increases by the spiral air flows and thus the behavior (amplitude) of the vibration mirror part 41 is destabilized.

However, in the present embodiment, the protruding portions 41b are provided at both end portions of the vibration mirror part 41 in the main scanning direction to extend to the outer side of the main scanning direction. Accordingly, frictional force is applied to the first airflow D1 from the surface of the protruding portions 41b, so that it is possible to sufficiently reduce the flow speed of the first airflow D1. In this way, the flow speed difference between the first airflow D1 and the second airflow D2 is made small as much as possible, so that it is possible to reduce spiral air flows which are generated at both end portions of the vibration mirror part 41 in the main scanning direction. Thus, the air resistance of the vibration mirror part 41 is prevented from being increased by these spiral air flows, so that it is possible to stabilize the behavior of the vibration mirror part 41.

Herein, when the width W of the protruding portion 41b is large, since force by which the protruding portion 41b pushes air also becomes large, the flow speed of the first airflow D1 is accelerated. Therefore, the flow speed difference between the first airflow D1 and the second airflow D2 increases, so that spiral air flows are easily generated. In this regard, it is preferable that the width W of the protruding portion 41b is small from the standpoint in which the flow speed of the first airflow D1 is suppressed. Herein, the air flow of one side and the air flow of the other side of the first airflow D1 in the sub-scanning direction are respectively proportional to W/2 (W is the width of the protruding portion 41b). On the other hand, the flow speed of the second airflow D2 is proportional to the thickness t of the protruding portion 41b. In this regard, in order to suppress the generation of spiral air flows by reducing the flow speed difference between the first airflow D1 and the second airflow D2, it is preferable to satisfy a relation of W/2<t.

Figure 6:
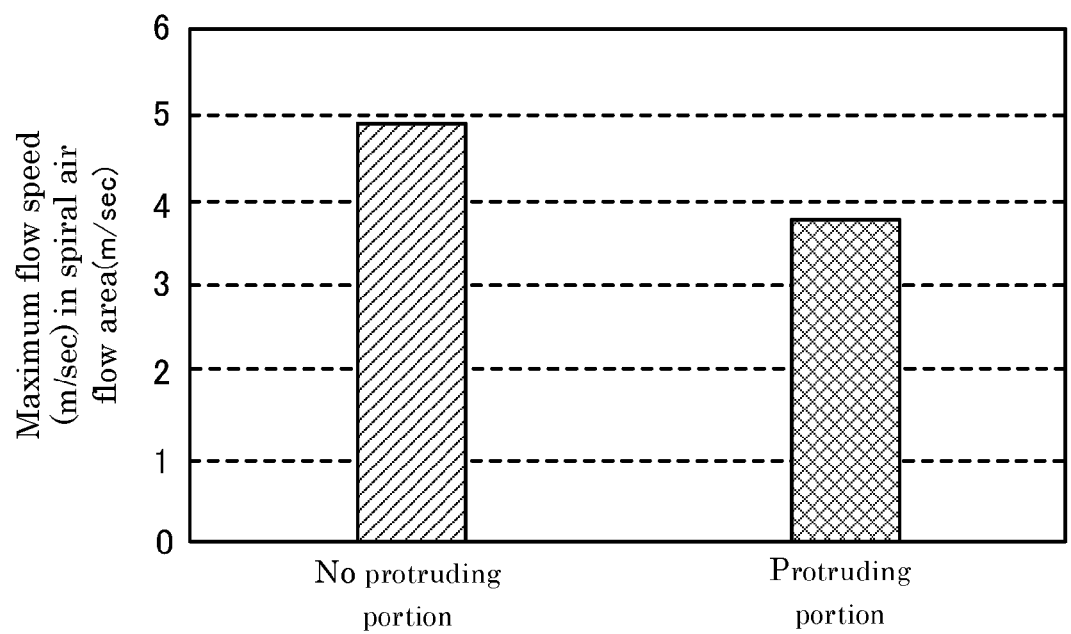
FIG. 6 is a graph illustrating results obtained by calculating the flow speeds of spiral air flows generated around a vibration mirror part with respect to each of the case in which protrusion parts have been formed at both end portions of the vibration mirror part in a main scanning direction and the case in which the protrusion parts have not been formed.

FIG. 6 is a graph illustrating results obtained by calculating a maximum flow speed in spiral air flow generation areas (around both end portions of the vibration mirror part 41 in the main scanning direction) with respect to the case in which the vibration mirror part 41 has the protruding portion 41b and the case in which the vibration mirror part 41 does not have the protruding portion 41b. This calculation has been performed by CFD (Computational Fluid Dynamics) analysis. The long diameter of the elliptical columnar portion 41a of the vibration mirror part 41 used in the calculation model is 4 mm. The length of the protruding portion 41b in the sub-scanning direction is 0.1 mm and the length of the protruding portion 41b in the main scanning direction is 0.25 mm. The swing frequency of the vibration mirror part 41 was set to 2,000 Hz.

According to the calculation result, it can be understood that the protruding portion 41b is provided, so that the maximum flow speed is reduced by about 20% in the aforementioned spiral air flow area. It is considered that this is because the flow speed of the aforementioned first airflow D1 has been reduced by providing the protruding portion 41b. The reduction of the maximum flow speed of the spiral air flow, that is, represents that the generation amount of the spiral air flow is reduced and air resistance acting on the vibration mirror part 41 is reduced.

Figure 7:
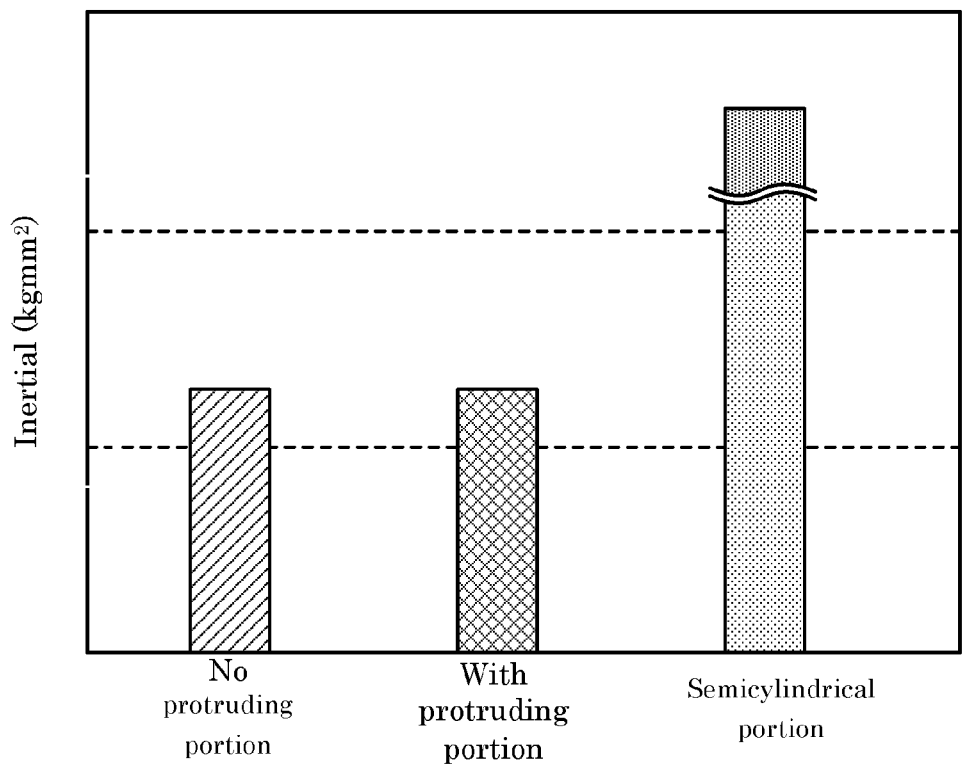
FIG. 7 is a graph illustrating results obtained by calculating inertia around a swing shaft (a torsion bar part) with respect to each of the case in which protrusion parts have been formed at both end portions of a vibration mirror part in a main scanning direction, the case in which the protrusion parts have not been formed at both end portions, and the case in which a semicylindrical rectifying member has adhered to a surface of an opposite side of a reflection surface side of the vibration mirror part.
Figure 8:
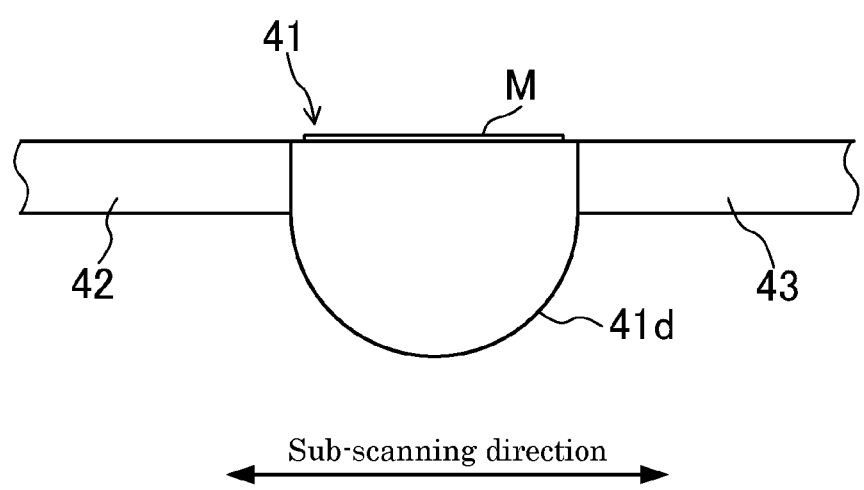
FIG. 8 is a schematic diagram when viewed from a main scanning direction, which illustrates a comparison example, wherein in this comparison example, a semicylindrical rectifying member adheres to a surface of an opposite side of a reflection surface side of a vibration mirror part.

FIG. 7 is a graph illustrating results obtained by calculating an inertial moment around the swing shaft center A with respect to the case in which the vibration mirror part 41 does not have the protruding portion 41b, the case in which the vibration mirror part 41 has the protruding portion 41b, and the case in which a semicylindrical portion 41d has been bonded instead of providing the protruding portion 41b to the vibration mirror part 41 (for example, a configuration similar to Japanese Unexamined Patent Application Publication No. 2011-123176 and see FIG. 8 of the present application). According to the graph, in the configuration in which the protruding portion 41b is provided to the vibration mirror part 41, it can be understood that the inertial moment is not almost increased as compared with the case in which the protruding portion 41b is not provided to the vibration mirror part 41. Furthermore, in the configuration in which the protruding portion 41b is provided to the vibration mirror part 41, it can be understood that the inertial moment is remarkably reduced as compared with the case in which the semicylindrical portion 41d is bonded to the vibration mirror part 41. Consequently, in the aforementioned embodiment, it is possible to further stabilize the behavior of the vibration mirror part 41 while suppressing an increase in the inertial moment. The increase in the inertial moment is suppressed, so that it is possible to improve an energy saving property by reducing driving power of the vibration mirror part 41.

Figure 9:
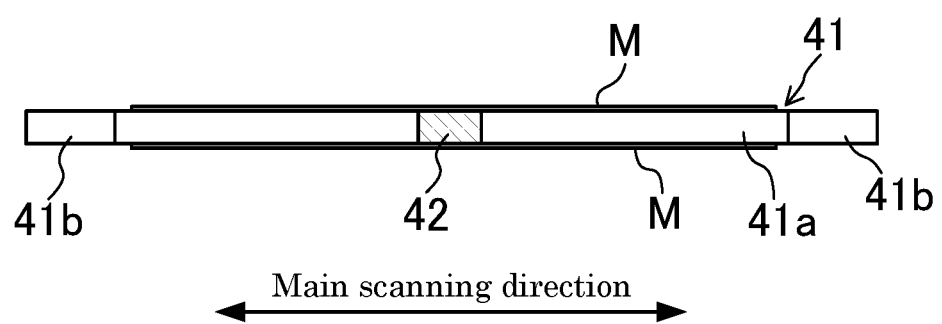
FIG. 9 is a side view of a vibration mirror part of an optical deflector according to a modification of an embodiment 1 when viewed from a swing shaft direction.

Furthermore, in the aforementioned embodiment, it is not necessary to bond a rectifying mechanism (the semicylindrical portion 41d in an example of FIG. 8) to an opposite side of the reflection surface portion M side of the vibration mirror part 41. Consequently, for example, as illustrated in FIG. 9, it is possible to use both side surfaces of the thickness direction of the vibration mirror part 41 as the reflection surface portion M. Consequently, it is possible to generate two scanning lights by using one vibration mirror part 41. Accordingly, the number of optical deflectors 40 mounted in the laser printer 1 is maximally reduced, so that it is possible to achieve compactification of the entire laser printer 1.

Furthermore, in the aforementioned embodiment, the facing surface 46b (see FIG. 3) of the fixed frame part 46, which faces the front end of the protruding portion 41b of the vibration mirror part 41, is formed in a flat surface shape. Accordingly to this, an air flow between an air flow flowed from the front end of the protruding portion 41b at the time of swing of the vibration mirror part 41 and the aforementioned facing surface 46b is prevented from being complicated, so that it is possible to suppress the generation of spiral air flows.

<<Embodiment2>>

FIG. 10 illustrates an embodiment 2. This embodiment is different from the aforementioned embodiment 1 in that each protruding portion 41b is configured by a pair of protrusions 41c.

The pair of protrusions 41c are formed in a rectangular plate shape long in the main scanning direction. The pair of protrusions 41c are formed spaced apart from each other in the sub-scanning direction. It can also be said that the shape of the aforementioned protruding portion 41b is a shape obtained by notching a center portion of the sub-scanning direction of a rectangular plate part extending in the main scanning direction.

Accordingly to this configuration, only portions (both both end portions of the sub-scanning direction) of the protruding portion 41b in the embodiment 1, in which the flow speed of the first airflow D1 is the fastest, are made left and the other portions are notched, so that it is possible to reliably suppress the generation of spiral air flows while maximally suppressing an increase in the inertial moment around the swing shaft center A.

<<Other Embodiments>>

In the aforementioned each embodiment, the laser printer has been described as an example of an image forming apparatus mounted with the optical deflector 40; however, the technology of the present disclosure is not limited thereto and the image forming apparatus may be a copy machine, a multifunctional peripheral (MFP), a facsimile and the like.

What is claimed is:

1. An optical deflector comprising:
   a vibration mirror part having a reflection surface portion for reflecting light, the vibration mirror part being formed in an elliptical shape elongated in a main scanning direction of reflected light viewed from a thickness direction of the vibration mirror part;
   a torsion bar part connected to the vibration mirror part; and
   a piezoelectric element that allows the vibration mirror part to swing around the torsion bar part so as to vibrate,
   wherein protruding portions are formed respectively at both end portions of the vibration mirror part in the main scanning direction of reflected light to protrude to an outer side in the main scanning direction,
   wherein each of the protruding portions only includes a pair of protrusions arranged spaced apart from each other with a center line interposed therebetween in a swing shaft center direction viewed from the thickness direction of the vibration mirror part, and
   wherein the protrusions are each formed in a rectangular shape elongated in the main scanning direction of reflected light viewed from the thickness direction of the vibration mirror part.

2. The optical deflector of claim 1, wherein, when a dimension of the swing shaft center direction of the vibration mirror part in the protruding portions is set as W and a thickness in a swing direction of the vibration mirror part is set as t, a relation of $W/2 < t$ is satisfied.

3. The optical deflector of claim 1, further comprising:
   a fixed frame part that supports the vibration mirror part via the torsion bar part,
   wherein surfaces of the fixed frame part, which face front ends of the protruding portions of the vibration mirror part, are formed in a flat surface shape.

4. An image forming apparatus including the optical deflector of claim 1.

5. The optical deflector of claim 1, wherein the reflection surface portion is formed at both side surfaces of the vibration mirror part in the thickness direction of the vibration mirror part.

* * * * *